(12) United States Patent
Ogata (10) Patent No.: US 6,462,958 B2
(45) Date of Patent: Oct. 8, 2002

(54) SHIELDED AND GROUNDED ELECTRONIC DEVICE

(75) Inventor: Hiroki Ogata, Tokyo (JP)

(73) Assignee: Sony Computer Entertainment, Inc., Tokyo (JP)

(*) Notice: Subject to any disclaimer, the term of this patent is extended or adjusted under 35 U.S.C. 154(b) by 0 days.

(21) Appl. No.: 09/850,751

(22) Filed: May 8, 2001

(65) Prior Publication Data

US 2001/0046128 A1 Nov. 29, 2001

(30) Foreign Application Priority Data

May 9, 2000 (JP) .................................. 2000-135783

(51) Int. Cl.$^7$ .............................. H05K 7/14; H05K 9/00
(52) U.S. Cl. ..................... 361/800; 361/752; 361/759; 361/799; 361/816; 174/35 R; 174/51; 220/4.02
(58) Field of Search ............................ 361/752, 753, 361/737, 759, 800, 799, 801, 802, 816, 818; 220/4.02; 174/51, 35 R; 206/719

(56) References Cited

U.S. PATENT DOCUMENTS

| | | | |
|---|---|---|---|
| 5,107,404 A | * 4/1992 | Tam | 361/736 |
| 5,111,362 A | * 5/1992 | Flamm et al. | 220/4.02 |
| 5,206,796 A | * 4/1993 | Thompson et al. | 174/35 R |
| 5,414,597 A | * 5/1995 | Lindland et al. | 174/35 R |

FOREIGN PATENT DOCUMENTS

| | | |
|---|---|---|
| EP | 0 892 594 A3 | 1/1999 |
| EP | 0 892 594 A2 | 1/1999 |
| JP | 1-67790 | 5/1989 |
| JP | 01-225200 | 9/1989 |
| JP | 10-307641 | 11/1998 |
| JP | 11-274763 | 10/1999 |

OTHER PUBLICATIONS

"Method of Mounting Multiple Circuit Cards in a Case" IBM Technical Disclosure Bulletin, IBM Corp. New York, US vol. 30, No. 8, 1988, pp. 424–425, XP002028522.

* cited by examiner

Primary Examiner—Jayprakash N. Gandhi
(74) Attorney, Agent, or Firm—Katten Muchin Zavis Rosenman (57) ABSTRACT

An electronic device having a cabinet formed from two halves that are joined together have provided therein multiple boards that are stacked and housed. The joining of the cabinet halves secures the boards in position within the cabinet and assures electrical continuity between boards, such that the positioning and arrangement of the boards within the cabinet upon assembly of the cabinet is not compromised by the cabinet being moved or flipped over.

18 Claims, 8 Drawing Sheets

SHIELDED AND GROUNDED ELECTRONIC DEVICE

FIELD OF THE INVENTION

This invention concerns an electronic device that has multiple boards including a circuit board and a cabinet inside which these multiple boards are accommodated, and in particular, it concerns an assembly of boards that are stacked in a simplified and secure manner within such cabinet.

BACKGROUND OF THE INVENTION

Heretofore, entertainment devices, personal computers, and other electronic devices that employ an optical disk, such as game machines, CD and DVD players and the like, have been constituted to have a disk device that includes an optical pickup unit, a circuit board on which a CPU and image processing unit are mounted, and a cabinet made up of an upper case and lower case that houses such components. And if for example it is an entertainment device, image information and sound information recorded on an optical disk can be played by detecting it with the optical pickup unit, computation-processing it with the CPU and image processing unit, and outputting video and audio control signals to a display device, etc.

With such an electronic device, the playback of image information and sound information is greatly affected by the processing capacity of the CPU and image processing unit, so it is required that the processing capacity of the CPU and image processing unit be speeded up. Here, when the processing capacity of the CPU and image processing unit is speeded up, the electromagnetic waves emitted from their circuit elements become stronger, and normally measures against EMI are implemented in such electronic devices.

Specifically, if the cabinet is made of ABS resin, etc., anti-EMI measures are accomplished by covering the circuit board, that includes the CPU and image processing unit, with metal shielding plates and ensuring electrical continuity between these shielding plates and the grounding pattern formed on the circuit board, which means that the circuit board is housed inside the cabinet and sandwiched in between two metal shielding plates.

Heretofore, such an electronic device has been assembled by (1) attaching a shielding plate to the base of the upper case of the cabinet, (2) attaching the circuit board onto the shielding plate and fixing the circuit board and shielding plate in place with screws or other means to ensure anchoring and electrical continuity, then (3) attaching another shielding plate onto the circuit board and fixing the shielding plate on the circuit board with screws or other means, (4) putting the upper plate over it, then (5) turning over the electronic device, inserting anchoring screws or other anchoring members into holes formed on the lower surface of the lower case, and joining and anchoring it to the upper case.

But the problem with such a conventional assembly method is that the circuit board and shielding plates must each be screwed in place, which can make the assembly operation more complex. Not only does increasing the number of screw-on locations make the assembly operation more complex, it is also undesirable for making the electronic device smaller. And because the top surface of the cabinet of the electronic device is important for aesthetic design considerations, it is undesirable to allow anchoring screws, etc. to appear on the top surface of the cabinet, and the anchoring screws must be inserted from the lower surface of the lower case, which creates the problem that the operation of flipping over the electronic device during the assembly operation is unavoidable.

OBJECTS OF THE INVENTION

It is an object of the present invention, therefore, to provide an electronic device that makes it possible to simplify the assembly operation by reducing the number of screw-on locations and allows it to be made smaller by reducing the number of parts.

It is a further object of the present invention to provide an electronic device having multiple boards that are secured in a simplified manner within such device.

It is a further object of the present invention to provide an electronic device having multiple boards that are anchored to said device and are prevented from moving within said device.

Still other objects and advantages of the invention will become clear upon review of the following detailed description in conjunction with the appended drawings.

SUMMARY OF THE INVENTION

An electronic device is provided with a cabinet in which is housed multiple boards including a circuit board. The cabinet is formed by combining two cabinet members, one of which is provided with a recessed part and the other of which is provided with hold-down members. Multiple boards are housed and anchored within said cabinet member by the assembly of said cabinet members.

The use of hold-down members and the manner in which the boards are anchored reduces the number of screw-on locations, which is advantageous for making the electronic device smaller.

In addition, one of he multiple boards consists of a circuit board and two shielding plates cover the front and back surfaces of this circuit board, and the cabinet is made of a synthetic resin such as ABS resin or the like. The two shielding plates cover the front and back surfaces of the circuit board as an anti-EMI measure for the circuit board.

In addition, if a grounding pattern is formed on the board surface of said circuit board, it is desirable that the aforesaid holding-down members be constituted so that they are set in accordance with the shape of this grounding pattern, and when pressure is applied by the joining of the cabinet members, electrical continuity of the grounding pattern with the shielding plates is ensured. Thus, the need to ensure electrical continuity by holding the circuit board and shielding plates in place with screws, etc. is eliminated, which simplifies the assembly operation without detracting from the function of the shielding plates. In addition, forming the grounding pattern on the rim of the circuit board can ensure electrical continuity, securely regulate the movement of the circuit board and shielding plates within the cabinet before they are anchored in place by the anchoring members, and make handling easy during the assembly operation.

DETAILED DESCRIPTION OF THE PREFERRED EMBODIMENTS

The following detailed description is of the best mode or modes of the invention presently contemplated. Such description is not intended to be understood in a limiting sense, but to be an example of the invention presented solely for illustration thereof, and by reference to which in connection with the following description and the accompanying drawings one skilled in the art may be advised of the advantages and construction of the invention. In the various views of the drawings, like reference characters designate like or similar parts.

Figure 1:
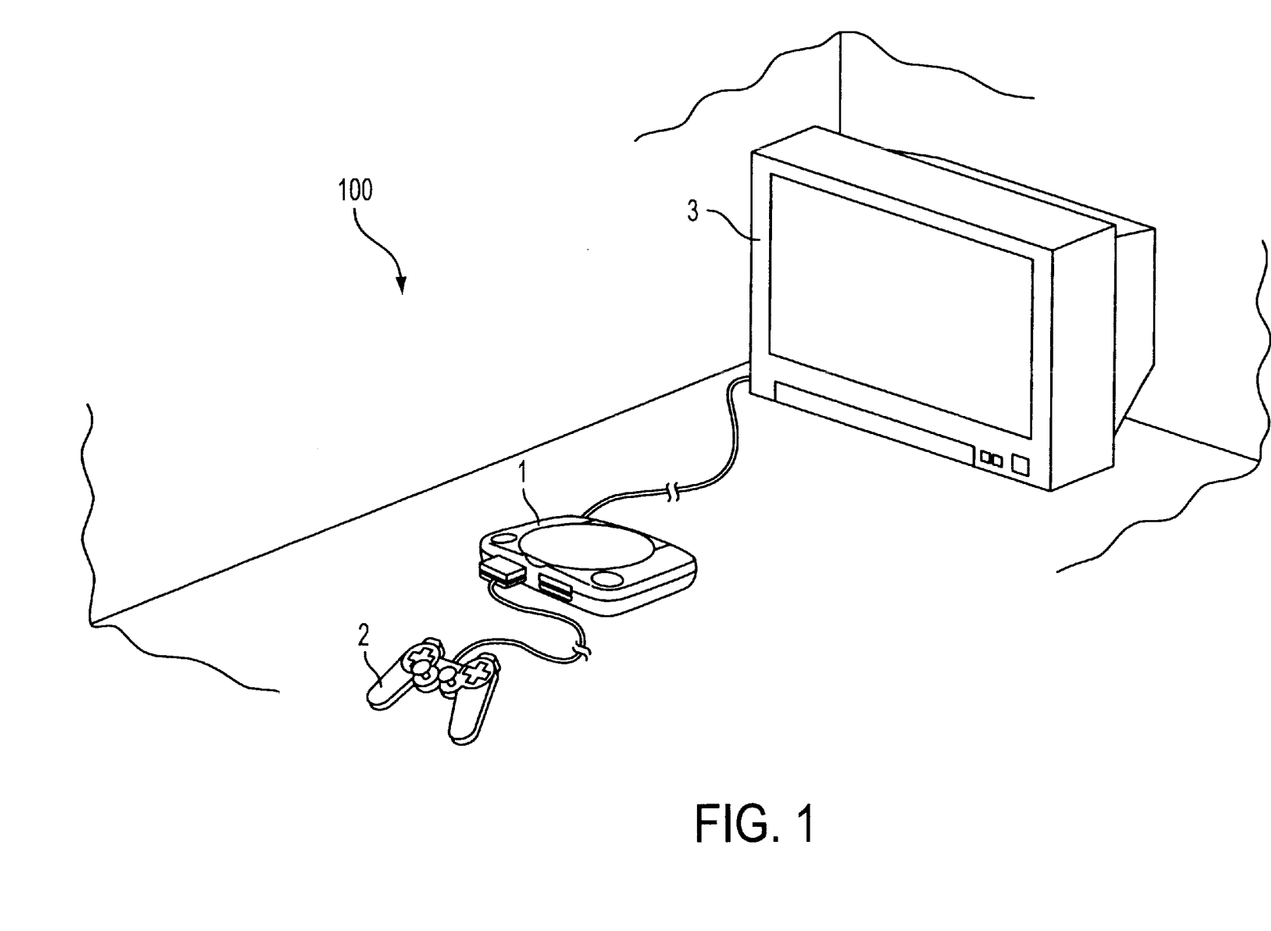
FIG. 1 is a perspective view showing the use of an electronic device of the present invention.

FIG. 1 shows part of a living room 100 having set up therein a television receiver 3, which outputs images and sound, etc., an entertainment device 1, which is an electronic device that is connected to this television receiver 3, and a controller 2, which is an operation device that sends instructions to the entertainment device 1. Entertainment device 1 for example reads a game program, etc. recorded on an optical disk, etc. and executes it according to instructions from controller 2 operated by the user (game player).

Figure 2:
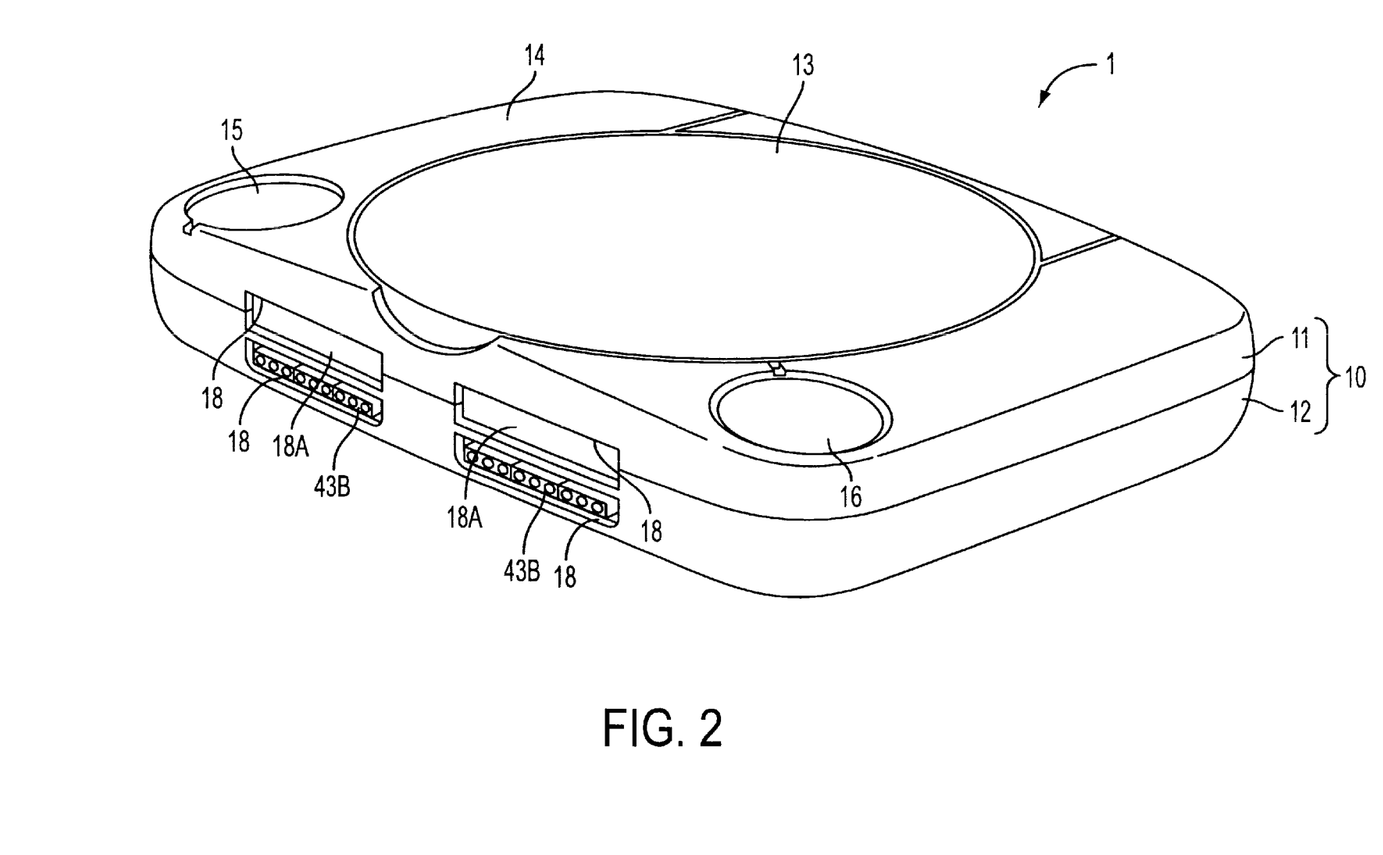
FIG. 2 is a perspective view of the electronic device of the present invention.
Figure 3:
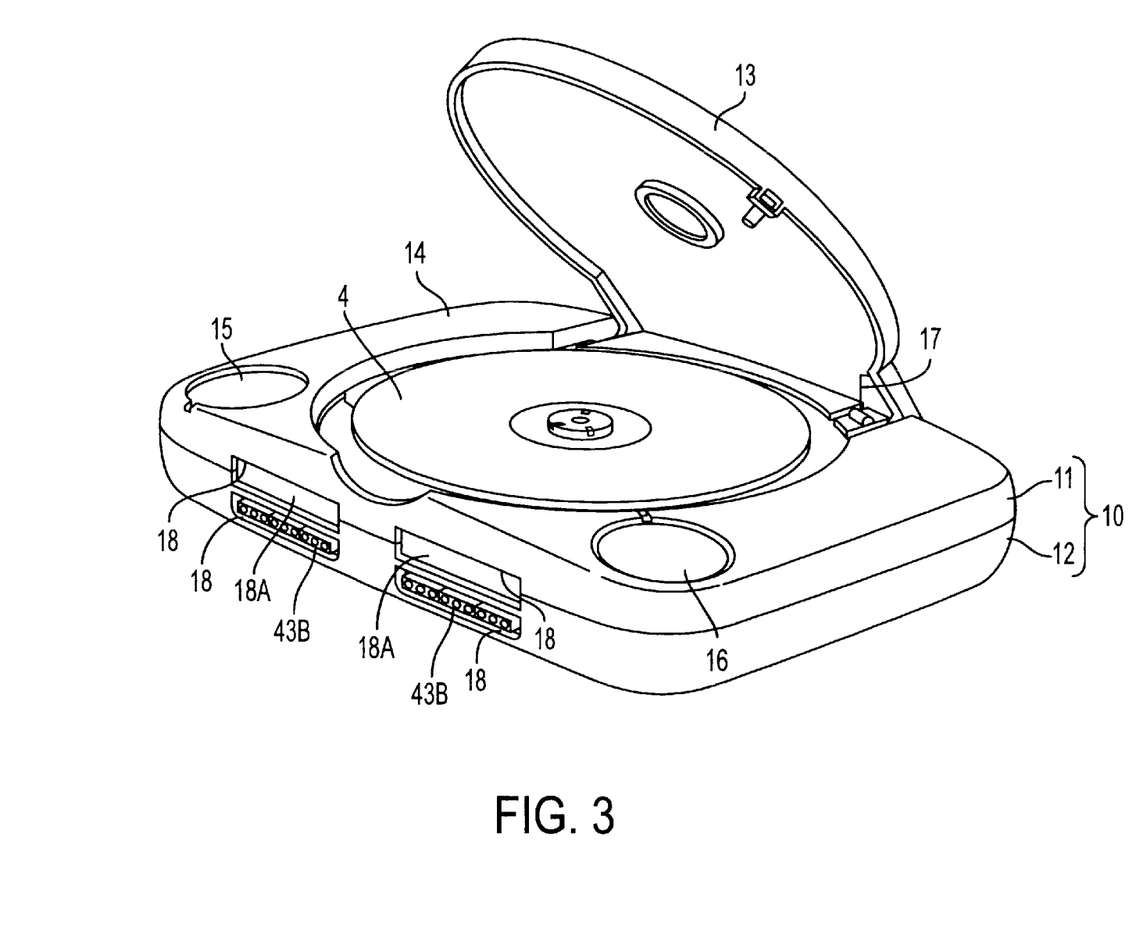
FIG. 3 is a perspective view showing the cover of the electronic device in the open position.

As shown in FIG. 2, entertainment device 1 comprises a device main body (not pictured), which has electronic parts, etc., and a cabinet 10, which is preferably made of ABS resin and has an upper case 11 and a lower case 12, which both accommodate the device main body. Upper case 11 further comprises a roughly circular cover 13 provided in the middle and an upper case main body 14 provided around this cover 13. On the left side of cover 13 is a power button 15, and on the right side of cover 13 is an open/close button 16, into which is built an engaging member, not pictured, that advances and retracts with respect to cover 13 for opening and closing said cover 13. As shown in FIG. 3, one end of cover 13 is rotatably attached to upper case main body 14, such that between cover 13 and upper case main body 14 is a coil spring 17, which is wound around the rotation shaft of cover 13 and biases the cover 13 open upon the pressing of button 16. Specifically, in the state shown in FIG. 2, when button 16 is pressed, cover 13 opens due to the impelling force of coil spring 17, and chucking member 62 (see FIG. 4, to be described below) is exposed. After cover 13 is opened, optical disk 4 is mounted onto chucking member 62, and when cover 13 is closed and power button 15 is pressed, electric power is turned on to the device main body and the content recorded on optical disk 4 can be played back.

Figure 4:
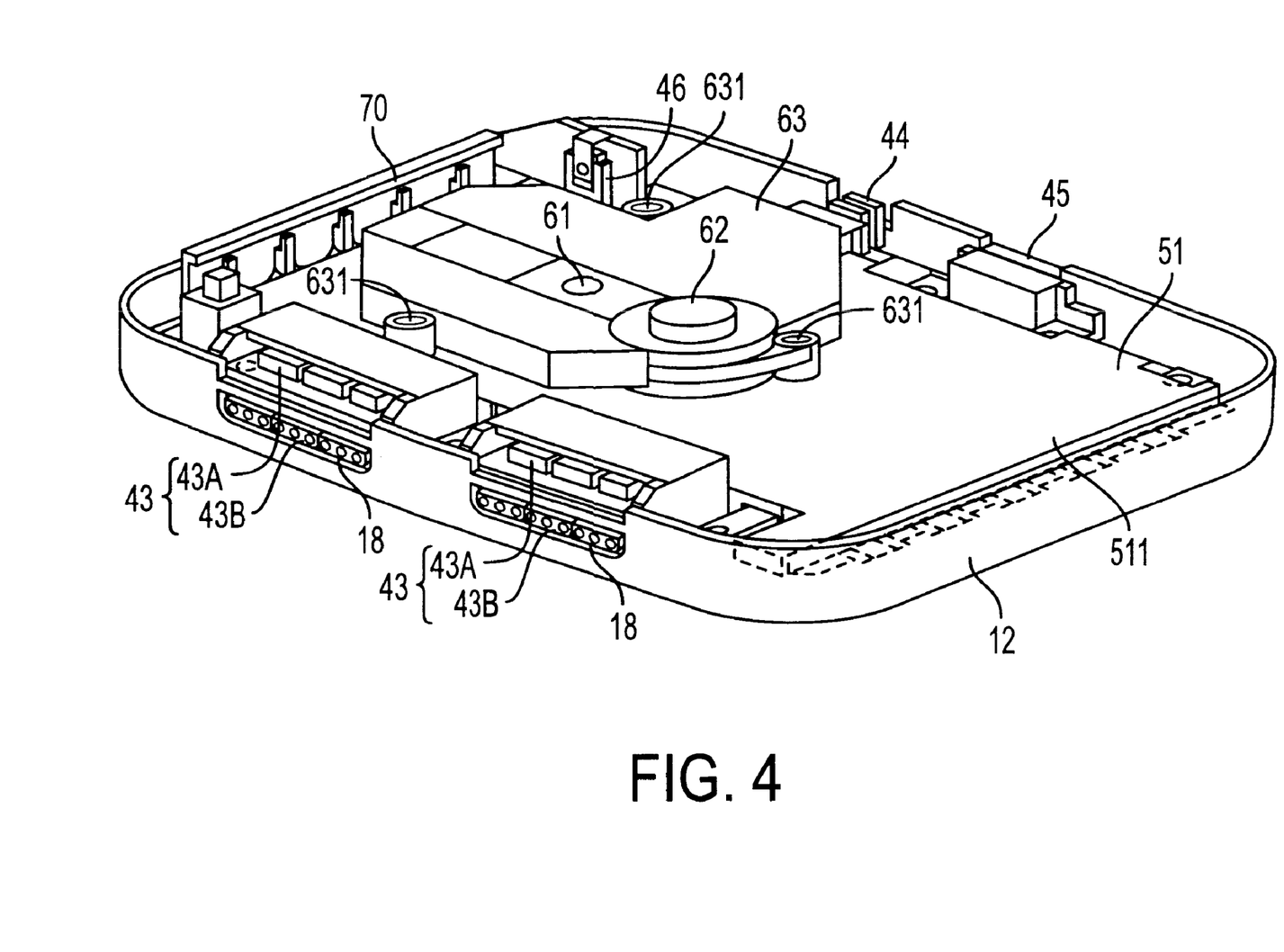
FIG. 4 is a perspective view showing a portion of the internal structure of the electronic device of the invention.

In addition, four openings 18 are formed on the front surface of cabinet 10 as shown in FIGS. 2–4; through which are exposed memory card connection parts 43A (FIGS. 4 and 5) to be mounted on circuit board 40 (see FIG. 5 described below) and are positioned on the upper level of the openings 18, and through which are exposed controller connection parts 43B, which are likewise to be mounted on circuit board 40 and are positioned on the lower level of the openings 18. Moreover, openings 18 where memory card connection parts 43A are positioned are blocked by shutters 18A, and when the end of a memory card (not shown) is pushed in, this shutter 18A opens allowing the memory card to be connected to memory card connection part 43A.

The side of cabinet 10 opposite the side on which openings 18 are formed is provided with an opening that exposes power connector 44 (FIG. 4) for supplying electric power from an external power source (not shown) to the device main body, and an opening that exposes audiovisual output terminal 45 for outputting to television receiver 3 the audio, video, and other signals recorded on the optical disk.

Figure 5:
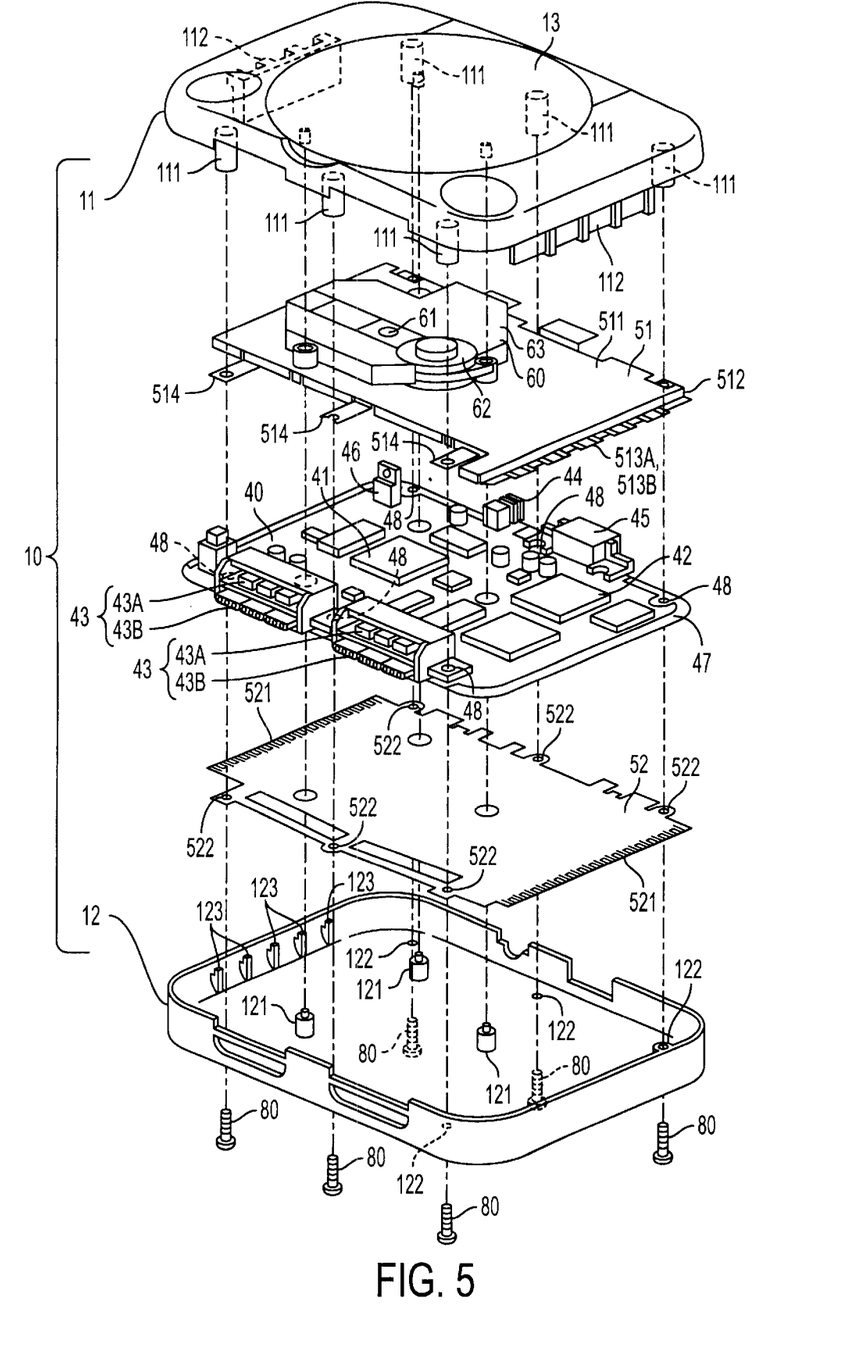
FIG. 5 is an exploded perspective view of an electronic device of the invention.

As shown in FIGS. 4 and 5, the device main body accommodated in cabinet 10, comprises a circuit board 40, which controls entertainment device 1, metal shielding plates 51 and 52, which are laminated with this circuit board 40 and cover the front and back surfaces of said circuit board 40, disk device 60, which includes optical pickup unit 61 mounted in contact with the upper surface of shielding plate 51, and heat sink 70 as a heat dissipator of three-terminal regulator 46, which is discussed below. Mounted on said circuit board 40, besides various circuit elements including CPU 41, and image processing unit 42, are connection units 43, which are constituted integrally with memory card connection parts 43A and controller connection parts 43B, power source connector 44, and audiovisual output terminal 45. Also, formed on circuit board 40 is a power supply wiring pattern for supplying electric power to CPU 41 via power source connector 44, and mounted on this power supply wiring pattern is three-terminal regulator 46 for stabilizing the supplied voltage. In addition, grounding pattern 47 is formed on the rim part of such circuit board 40 for obtaining the ground electric potential. Moreover, although not pictured, this grounding pattern 47 is also formed on the rear-side rim part of circuit board 40. Also, insertion holes 48 to be pierced by anchoring screws 80 are multiply formed in positions where grounding pattern 47 is formed on the front and rear end edges of circuit board 40.

Shielding plate 51, which covers the circuit element mounting surface of circuit board 40, has flat plate-shaped part 511, with which disk device 60 comes into contact, and rib-shaped part 512, which is provided on the rim of this flat plate-shaped part 511, and flat plate-shaped part 511 and rib-shaped part 512, by covering three sides and the top of CPU 41 and image processing unit 42, prevent electromagnetic waves from leaking outside the device from these circuit elements 41 and 42. And as shown in FIG. 4, flat plate-shaped part 511 and rib-shaped part 512 are formed in such a way as to expose connecting unit 43 to the outside in the state in which circuit board 40 and shielding plate 51 are combined, and are constituted so that the electromagnetic waves generated from CPU 41, etc. do not interfere with memory card connection parts 43A or controller connection parts 43B as noise.

Figure 6A:
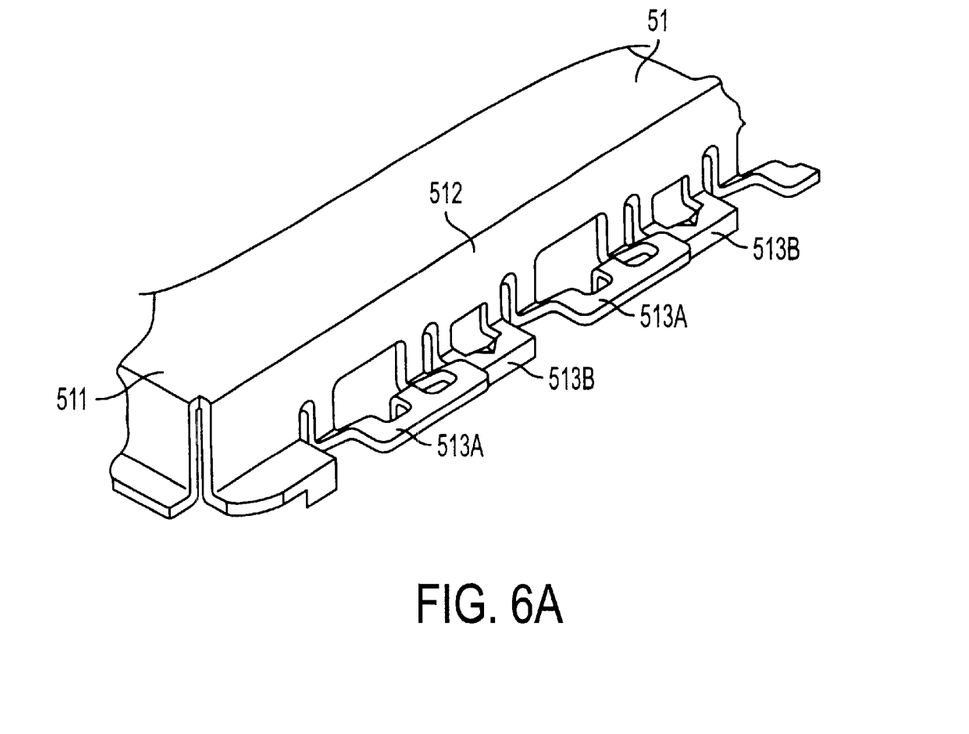
FIG. 6A is a partial perspective view showing the end of one of the shielding plates used in the electronic device of the invention.

As shown in FIG. 6A, pieces 513A and 513B, in which part of rib-shaped part 512 is cut upward, are multiply formed on the side of shielding plate 51 in positions corresponding to grounding pattern 47 on the rim of circuit board 40. These cut-upward pieces 513A and 513B each have a slightly different cut-upward angle in the vertical direction: cut-upward pieces 513A are set to an angle so that they are on the upper side with respect to the horizontal direction perpendicular to rib-shaped part 512, and cut-upward pieces 513B are set to an angle so that they are on the lower side with respect to the horizontal direction. In addition, three anchoring screw insertion holes 514 each are formed on the front and rear end edges of shielding plate 51.

Figure 6B:
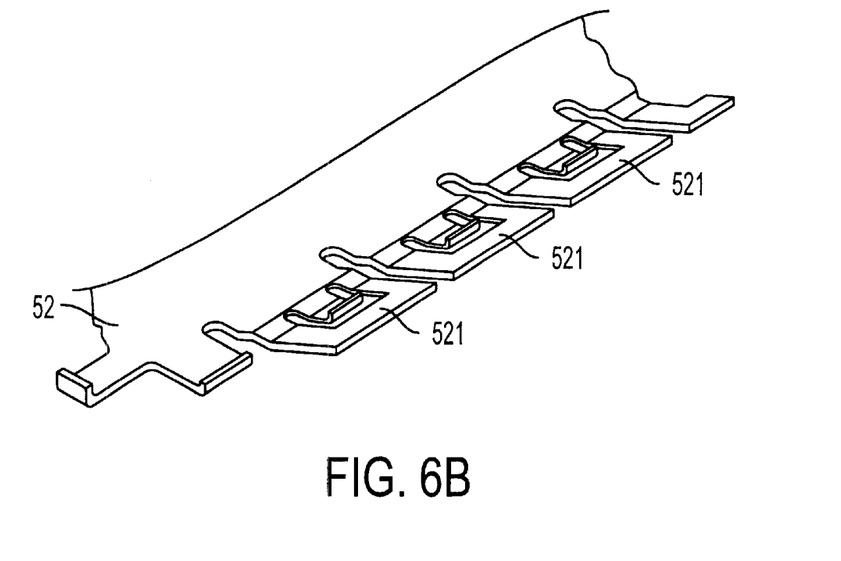
FIG. 6B is a partial perspective view showing the end of another one of the shielding plates used in the electronic device of the invention.

Shielding plate 52 consists of a metal flat plate material, and as with shielding plate 51, as shown in FIG. 6B, multiple cut-upward pieces 521, which are bent somewhat upward from the surface of shielding plate 52, are formed on its side rim corresponding to the position of the grounding pattern in the rear surface of circuit board 40 and six anchoring screw insertion holes 522 are formed on the front and rear end edges of plate 52. Moreover, although not pictured in FIG. 4, multiple bumps formed by press processing, etc. are formed in the middle part of shielding plate 52 so as to come into contact with the grounding pattern formed in the middle part on the rear surface side of circuit board 40 when in the combined state.

Disk device 60 is constituted so as to include optical pickup unit 61, chucking member 62, and case 63, and housed inside case 63 are a motor (not shown) that causes chucking member 62 to turn and a motor (not shown) that causes optical pickup unit 61 to slide. Also, disk device 60 is electrically connected with circuit board 40 via a cable (not shown), and the recorded content of optical disk 4 that is detected by optical pickup unit 61 is sent as an electrical signal to CPU 41, etc. of circuit board 40.

Formed on the base of lower case 12, in which such circuit board 40, shielding plates 51 and 52, and disk device 60 are accornmodated, are three protrusions 121 (see FIGS. 5 and 8), which stand approximately in the middle of case 12, and insertion holes 122, into which are inserted anchoring screws 80, which serve as anchoring members, and multiple protrusions 123 formed on the inside rim surface of lower case 12. The three protrusions 121 that stand approximately in the middle of case 12, which are provided in order to support the weight of disk device 60, pierce shielding plates 51 and 52 and circuit board 40 through openings therein and support the lower surface of disk device 60. Therefore disk device 60 comes into direct contact with shielding plate 51, but its own weight is supported strictly by protrusions 121. For this purpose, three engagement holes 631 for engaging with protrusions 121 are formed on the rim of case 63. Also, although not shown in the drawings, cushioning material is interposed between protrusions 121 and engagement holes 631, and any vibration acting on entertainment device 1 is absorbed by this cushioning material to suppress any vibration of disk device 60.

Figure 7:
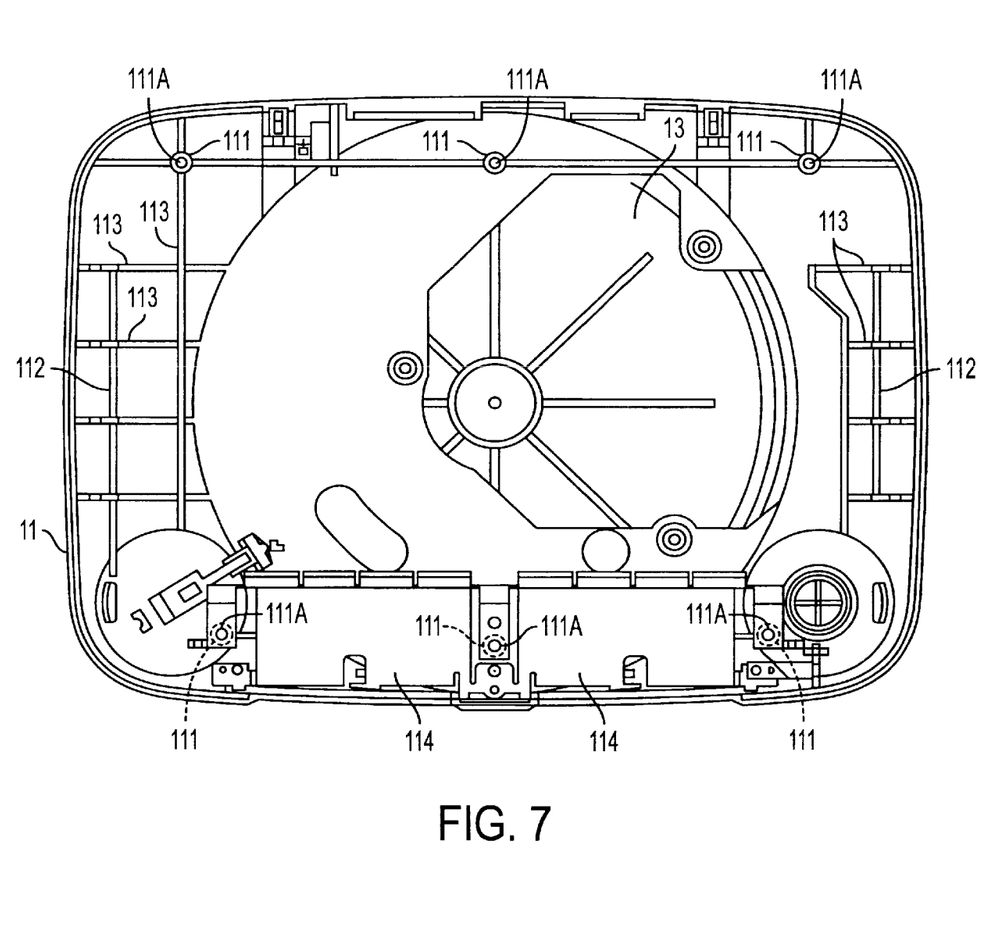
FIG. 7 is a front view showing a portion of the accessory device of the invention.

Meanwhile, on the inside rim surface of upper case 11 are formed protrusions 111 corresponding to the position of insertion holes 122 of lower case 12, and panel-shaped ribs 112 are formed protruding in position corresponding to grounding pattern 47 of circuit board 40, and these protrusions 111 and panel-shaped ribs 112 serve as holding-down members. As shown in FIG. 7, protrusions 111 are preferably cylindrical in shape, and formed inside them are screw holes 111A that make threaded engagement with anchoring screws 80 (FIG. 5). Panel-shaped ribs 112 serve as holding-down members in the sense that they push circuit board 40 and shielding plates 51 and 52 against lower case 12 from the outside surface of these panels (FIG. 8), and are formed so as to correspond to the position of grounding pattern 47 on the circuit board 40 side. With these panel-shaped ribs 112, reinforcing ribs 113 (FIG. 7) are formed in a grid pattern on the inside rim surface of upper case 11 near the base of panel-shaped ribs 112 so as to surround these panel-shaped ribs 112 in order that a force will act on these panel-shaped ribs 112 if upper case 11 and lower case 12 are assembled together to house circuit board 40, shielding plates 51 and 52, and disk device 60.

Metal shielding plates 114 (FIG. 7) are provided on the inside rim surface of upper case 11 and correspond to openings 18 (FIGS. 2 and 3) that correspond to memory card connection parts 43A; and cover the upper surface, side surfaces, and back surface of connection units 43, and are constituted so that the input signals from controller 2 and the output signals to the memory card are affected by noise as little as possible. Also, shielding plates 114 are secured to the inside rim surface of upper case 11 and also function as a shutter holding means that hold shutters 18A (FIGS. 2 and 3), which block openings 18 of memory card connection units 43A, against upper case 11.

The procedure for assembling entertainment device 1 as described above is as follows.

(1) Position shielding plate 52 inside lower case 12 such that the protrusions 121 extend through plate 52. Then position circuit board 40 on shielding plate 52 such that protrusions 121 extend through board 40. When positioning circuit board 40, it is preferably to insert board 40 inside opening 18 obliquely from the back so that the tip of controller connection parts 43B is exposed through openings 18.

(2) Position shielding plate 51 on circuit board 40, then put disk device 60 on top of plate 51 and cause the three protrusions 121 and engagement holes 631 to engage such that disk device 60 is supported by the three protrusions 121. Connect the cable (not picture) connected to disk device 60 to the connector (not pictured) that is mounted on the back side of connection unit 43.

Figure 8:
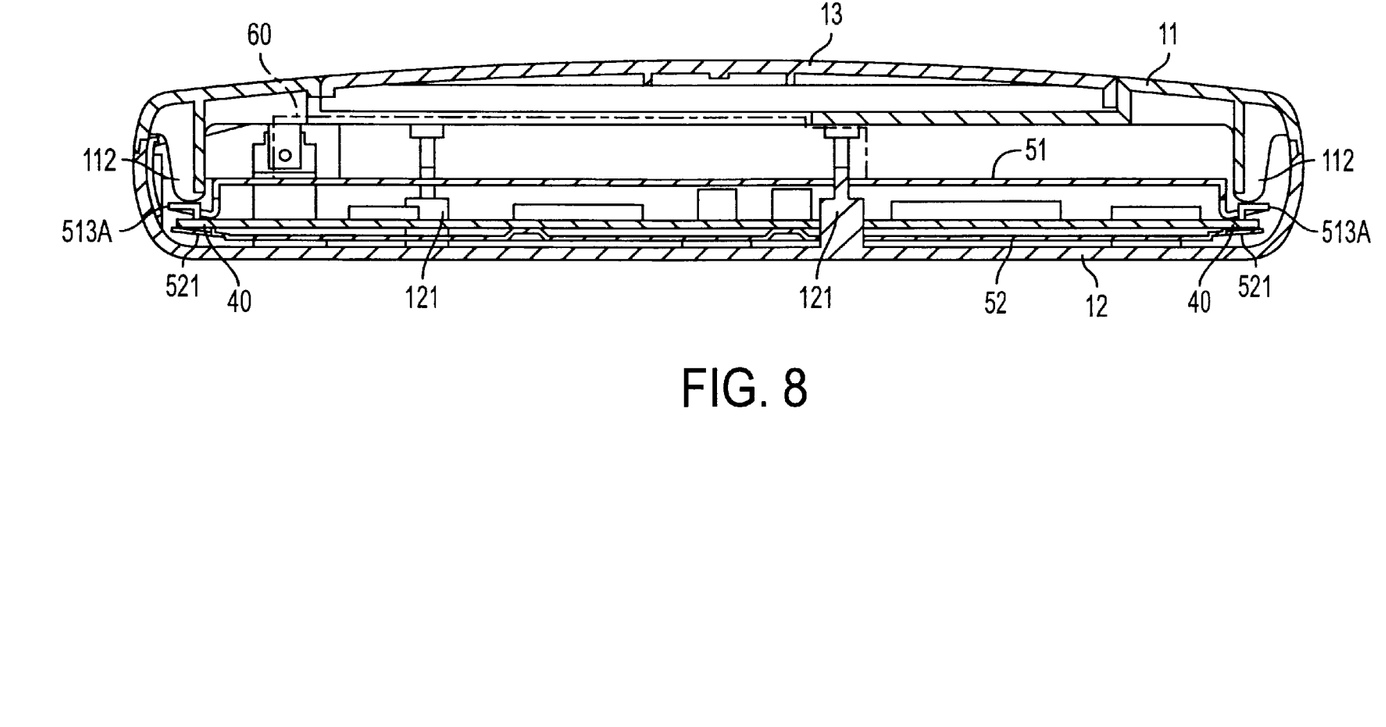
FIG. 8 is a vertical cross-sectional view of the electronic device of the invention.

(3) When the positioning of these is completed, engage the opening end rim of lower case 12 with the opening end rim of upper case 11. In doing so, as shown in FIG. 8, pieces 513A of shielding plate 51 are pushed against by said panel-shaped ribs 112, and pieces 513B are impelled against the surface of grounding pattern 47 of circuit board 40, and the electrical continuity of shielding plate 51 and grounding pattern 47 is ensured.

(4) Then ensure that on the lower surface side of circuit board 40 the grounding pattern of circuit board 40 is in contact in an impelled state with pieces 521 or the bumps (not shown in the diagram), and that there is electrical continuity between shielding plate 51 and the grounding pattern 47 on the rear surface of circuit board 40.

(5) With lower case 12 and upper case 11 engaged, flip over entertainment device 1 so that the base of lower case 12 is facing upward, insert anchoring screws 80 into insertion holes 122, and screw anchoring screws 80 into female screw holes 111A of protrusions 111 of upper case 11. While in this engaged state, panel-shaped ribs 112 and protrusions 111 press circuit board 40 and shielding plates 51 and 52 from the outside direction, and the side surface of panel-shaped ribs 112 comes into contact with rib-shaped parts 512 of shielding plate 51, so the constituent members inside do not move inside the cabinet even if the cabinet is flipped over and over.

Because protrusions 111 and panel-shaped ribs 112, which serve as holding-down members, are provided in the entertainment device of the invention, when upper case 11 and lower case 12 are combined, circuit board 40 and shielding plates 51 and 52 are held down by protrusions 111 and panel-shaped ribs 112 so that they do not move even when, during assembly, entertainment device 1 is flipped over or turned upside-down. Therefore, using anchoring screws 80, which join and anchor upper case 11 and lower case 12, circuit board 40 and shielding plates 51 and 52 can be anchored in place, and the assembly operation can be simplified.

Also, because the assembly of the present invention does not require the screwing of shielding plates 51 and 52 to the circuit board 40 to assure the electrical continuity of circuit board 40 and shielding plates 51 and 52, the number of screw-on locations can be reduced and the number of parts can be reduced, which is advantageous for making entertainment device 1 smaller.

In addition, because the construction is such that insertion holes 122 are formed on lower case 12 and anchoring screws 80 are inserted into these insertion holes 122, anchoring screws 80 are prevented from being exposed on the top surface of cabinet 10, which is desirable for the esthetic design of entertainment device 1.

In addition, because female screw holes 111A, which serve as joining parts, are formed in protrusions 111 as holding-down members, such holes do not have to be formed separately on the inside rim surface of upper case 11, so the inner surface of the inner rim surface of upper case 11 can be simplified and the manufacturing cost of cabinet 10 can be reduced.

In addition, panel-shaped ribs 112, which act as holding-down members, are set corresponding to grounding pattern 47, and panel-shaped ribs 112 hold down pieces 513A of shielding plates 51 and 52, so that pieces 513B and 521 are impelled against grounding pattern 47, and the electrical continuity between shielding plates 51 and 52 and grounding pattern 47 of circuit board 40 is ensured, which is further desirable as an anti-EMI measure.

Also, because grounding pattern 47 is formed on the rim of circuit board 40, the holding down of circuit board 40 and shielding plates 51 and 52 by panel-shaped ribs 112 can be made even more secure, the movement of these boards 40, 51, and 52 within cabinet 10 can be securely restricted, flipping it upside-down and other such handling is made easy, and the assembly operation can be further simplified.

Morever, this invention is not limited to the above embodiment; it also includes modifications such as, but not limited to the following.

In the above embodiment, while grounding pattern 47 is formed on the rim part of circuit board 40, and panel-shaped ribs 112 exert a pressing impelling force on shielding plates 51 and 52 and grounding pattern 47 a grounding pattern may be set in the middle part of the circuit board, and protrusion-shaped holding-down members may be positioned correspondingly to the position of this grounding pattern.

Also, in the above embodiment, while the joining and anchoring of upper case 11 and lower case 12 is effected by anchoring screws 80, the joining and anchoring of the upper case and lower case may also be effected by other anchoring members.

In addition, in the above embodiment, multiple cut-upward pieces 513A, 513B, and 521 are formed on the side edges of shielding plates 51 and 52, but as long as electrical continuity with the grounding pattern of the circuit board can be ensured, it is not necessary to form cut-upward pieces. For example, electrically conductive material may be interposed between the shielding plates and the circuit board. Also, the electrical continuity between the grounding pattern and the shielding plates need not be done on the side edges of the circuit board; it may be done in any appropriate position on the circuit board.

And although this invention is described in connection with an entertainment device 1, it may be applied to a personal computer or other electronic device. For example, one preferable embodiment might be a notebook-type personal computer having a cabinet made of synthetic resin.

In other respects, the specific structure and shape, etc. when implementing this invention may be made as other structures, etc. to the extent that the purpose of this invention can be achieved.

With this invention such as described above, because holding-down members that hold multiple boards against one cabinet member are provided on the other cabinet member, the multiple boards are held down in the state in which the two cabinet members are combined, preventing the multiple boards from moving within the cabinet even if the electronic device is turn upside-down. Therefore multiple boards can be held in place simultaneously by using anchoring members of the cabinet members, thus simplifying the assembly operation.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention.

I claim:

1. An electronic device comprising:
   a) a cabinet having multiple boards, each board having positioning holes, said cabinet formed from a first cabinet member and a second cabinet member,
   b) said first cabinet member comprising a plurality of holding members and a plurality of anchor-receiving members,
   c) said second cabinet member comprising a plurality of protrusions, said multiple boards being positionable on said second cabinet member by aligning said positioning holes with said plurality of protrusions,
   d) wherein said multiple boards are held against said second cabinet member by the plurality of holding members resulting from the joining of said first and second cabinet members,
   e) wherein said multiple boards comprises a circuit board having a perimeter, a front surface, a back surface and two shielding plates that cover the front and back surfaces of said circuit board, and
   f) wherein a grounding pattern is formed on the perimeter of the circuit board surface, and wherein said holding members are adapted to press against said grounding pattern such that electrical continuity is maintained between said shielding plates and said control board when said holding members are pressed against said multiple boards.

2. An electronic device in accordance with claim 1, further comprising anchor members adapted for extension through said second cabinet member and further adapted for receipt in said anchor-receiving members in said first cabinet member for securing said first and second cabinet members together.

3. An electronic device in accordance with claim 1, wherein said circuit board has a rim and said grounding pattern is formed on the rim of said circuit board.

4. An electronic device in accordance with claim 3, wherein said grounding pattern is formed on opposite edges of said rim.

5. An electronic device in accordance with claim 1, wherein said shielding plates further comprise impelling means for clamping said shielding plates against said grounding pattern during the joining of said first and second cabinet members.

6. An electronic device in accordance with claim 5, wherein said impelling means further comprises resiliently arranged clamping members provided on each shielding plate that are inwardly directed toward the circuit board and that are forced together during assembly of said first and second cabinet members.

7. An electronic device in accordance with claim 1, wherein said holding members further comprise ribbed panels.

8. An electronic device in accordance with claim 1, wherein said holding members and anchor-receiving members are disposed on opposite sides of said first cabinet member.

9. An electronic device in accordance with claim 1, wherein said holding members are disposed between said anchor-receiving members on each side of said first cabinet member.

10. An electronic device comprising:
   a) a first cabinet member having an inner floor surface, an inside rim surface and protrusions formed along said inner floor surface,
   b) a first shielding plate having alignment holes and positioned on said first cabinet member inner floor surface, such that said protrusions extend through said first shielding plate alignment holes,
   c) a circuit board having alignment holes and positioned on said first shielding plate, such that said protrusions extend through said circuit board alignment holes,
   d) a second shielding plate having alignment holes and positioned on said circuit board, such that said protrusions extend through said second shielding plate alignment holes,
   e) a second cabinet member having engagement holes and adapted for engagement with said protrusions, said second cabinet member covering said first cabinet member and engaged therewith by the engagement of said protrusions with said engagement holes, and
   f) paneled holding members positioned on said second cabinet member for holding said circuit board and said shielding plates against said first cabinet member and for creating line contact between said shielding plates and said grounding pattern during the assembly of said first and second cabinet members.

11. An electronic device in accordance with claim 10, wherein said holding members further comprise ribbed panels.

12. An electronic device in accordance with claim 10, wherein said holding members are positioned on a plurality of sides of said second cabinet member.

13. An electronic device comprising:
   a) a cabinet formed from first and second cabinet members,
   b) a circuit board having a perimeter and a grounding pattern disposed thereon, said circuit board being sandwiched between first and second shielding plates, each plate further comprising a perimeter and resilient clamping members disposed thereon and aligned with said grounding pattern,
   c) means for urging said resilient clamping members together so that said shielding plates forcefully contact said grounding pattern, and
   d) means for supporting said circuit board within said cabinet during joinder of said first and second cabinet members.

14. An electronic device in accordance with claim 13, wherein said urging means further comprises a panel-shaped holding member disposed in an alignment position with said clamping members on one of said first and second cabinet members.

15. An electronic device in accordance with claim 14, wherein said holding member is a ribbed panel.

16. An electronic device in accordance with claim 13, wherein said grounding pattern and said resilient clamping members are disposed on opposite edges of said circuit board and said shielding plates respectively.

17. An electronic device in accordance with claim 16, wherein said urging means further comprises panel-shaped holding members disposed on opposite sides of one of said first and second cabinet members and in an alignment position with said resilient clamping members.

18. An electronic device in accordance with claim 17, wherein said holding members are ribbed panels.

* * * * *